(12) United States Patent
Lee et al.

(10) Patent No.: US 6,703,693 B2
(45) Date of Patent: Mar. 9, 2004

(54) APPARATUS FOR REVERSING LEAD FRAME

(75) Inventors: Dong-Hoon Lee, Kyunggi-do (KR); Jong-Soo Oh, Kyunggi-do (KR); Ho-Youl Jeong, Kyunggi-do (KR); Ki-Mo Yang, Kyunggi-do (KR); Chae-Gon Kim, Kyunggi-do (KR); Seong-Kyu Kang, Seoul (KR)

(73) Assignee: LG Cable Ltd. (KR)

( * ) Notice: Subject to any disclaimer, the term of this patent is extended or adjusted under 35 U.S.C. 154(b) by 0 days.

(21) Appl. No.: 10/318,810

(22) Filed: Dec. 13, 2002

(65) Prior Publication Data

US 2003/0116832 A1 Jun. 26, 2003

(30) Foreign Application Priority Data

Dec. 13, 2001 (KR) .......................................... 2001-79080
Nov. 27, 2002 (KR) .......................................... 2002-74177

(51) Int. Cl.$^7$ ............................................ H01L 23/495
(52) U.S. Cl. ...................................... 257/666; 438/111
(58) Field of Search ........................... 257/666; 438/111

(56) References Cited

U.S. PATENT DOCUMENTS 5,987,722 A * 11/1999 Park et al. ................. 29/25.01
6,001,670 A * 12/1999 Mochida et al. ............ 438/111
6,078,099 A    6/2000 Liu et al. ..................... 257/676
6,093,959 A    7/2000 Hong et al. .................. 257/692

* cited by examiner

*Primary Examiner*—Hoai Ho
*Assistant Examiner*—Tu-Tu Ho
(74) *Attorney, Agent, or Firm*—Cantor Colburn LLP

(57) ABSTRACT

An apparatus for reversing upper and lower surfaces of a lead frame which passes through a silver-plating process in a lead frame manufacturing process includes at least one guide rail having a curved portion for guiding the lead frame to be fallen down and reversed along an arc of the curved portion, and a conveying roller provided under the guide rail to horizontally convey the fallen lead frame. Thus, since the lead frame is reversed through a specific structure without use of any robot, the malfunction problem of the prior art is solved and costs are reduced.

12 Claims, 7 Drawing Sheets

< prior Art >

< prior Art > ated downward in connection with the central portion, and an outer wire having an upper portion in a straight shape extended downward with being spaced apart from the upper portion of the inner wire, a central portion extended as much as 90° arc in connection with the upper portion, and a lower portion extended downward in a straight shape in connection with the central portion.

APPARATUS FOR REVERSING LEAD FRAME

BACKGROUND OF THE INVENTION

1. Field of the Invention

The present invention relates to an apparatus for reversing a lead frame, and more particularly to an apparatus for reversing upper and lower surfaces of a lead frame which passes through a silver plating process in a lead frame manufacturing method.

2. Description of the Related Art

A lead frame has a one-frame structure supporting a semiconductor chip. As shown in FIG. 1, the lead frame functions as a contacting port which electrically connects the chip with external terminals and as a path through which heat generated in the chip is radiated outside.

To make the lead frame 1, there are needed, in brief, a press process for stamping an original material, a silver-plating process for treating a wire bonding portion and a taping process.

In particular, upper and lower surfaces of the lead frame 1 are reversed in order to prevent damage caused when the lower surface plated after the silver-plating process is in contact with conveying rollers. In the prior art, as shown in FIG. 2, the lead frame 1 carried on rollers 2 are attached by absorption to a carrying unit 4 and transferred to a reversing robot 3. The reversing robot 3 then rotates the lead frame 1 at 180°, for the purpose of the reversing.

However, this conventional method shows many problems that too many costs are required to configure the reversing robot 3, a power is needed to drive the reversing robot 3, and there arise frequent malfunctions since the reversing robot 3 needs high accuracy.

SUMMARY OF THE INVENTION

The present invention is designed to overcome such problems of the prior art, and an objective of the invention is to provide an apparatus for reversing a lead frame which reverses upper and lower surfaces of the lead frame without any power.

Another objective of the invention is to provide an apparatus for reversing a lead frame which has a simple structure to minimize malfunctions and costs.

In order to accomplish the above objective, the present invention provides an apparatus for reversing a lead frame, which reverses upper and lower surfaces of the lead frame passing through a silver plating process, which includes at least one guide rail having a curved portion for guiding the lead frame to be fallen down and reversed along an arc of the curved portion, and a conveying roller provided under the guide rail to horizontally convey the fallen lead frame.

Preferably, the guide rail includes an inner wire having an upper portion and an inner central portion, which are in an arc shape ranging from an upper area to a central area, outer central portions connected to the inner central portion and extended as much as 90° arc with a predetermined space in the central area, and a lower portion in a straight shape extended downward in connection with the outer central portion, and an outer wire having an upper portion in a straight shape extended downward with being spaced apart from the upper portion of the inner wire, a central portion extended as much as 90° arc in connection with the upper portion, and a lower portion extended downward in a straight shape in connection with the central portion.

Alternatively, the guide rail may also include an inner wire having an upper portion of an arc shape, a central portion of a 'ㄷ' shape having a first horizontal portion, a vertical portion and a second horizontal portion, and a lower portion in a straight shape extended downward in connection with the central portion, and an outer wire having an upper portion in a straight shape extended downward with being spaced apart from the upper portion of the inner wire, a central portion extended as much as 90° arc in connection with the upper portion, and a lower portion extended downward in a straight shape in connection with the central portion.

In this case, the apparatus for reversing a lead frame may also include a cushion to be installed to one side of the central portion of the inner wire to stop and arrange the naturally-fallen lead frame with absorbing shock.

In both cases, a vertical central line of the inner wire is preferably offset from an initial drop position of the lead frame.

In addition, it is also preferable that there are provided a plurality of guide rails, and upper ends of the inner wires and upper ends of the outer wires are connected to each other through a connection rod.

The apparatus for reversing a lead frame may also include a base for supporting the guide rail, and a combining member for combining the guide rail to the base so that the height of the guide rail is adjustable.

In another case, it is also possible that the apparatus for reversing a lead frame includes a base for supporting the guide rail, and the guide rail is integrated with the base.

In any case, the bases can be installed under each guide rail in parallel to a longitudinal direction of the conveying rollers, and ends of the bases can be connected to each other through a connection bar.

BRIEF DESCRIPTION OF THE DRAWINGS

These and other features, aspects, and advantages of the present invention will become better understood with regard to the following description, appended claims, and accompanying drawings, in which like components are referred to by like reference numerals. In the drawings:

DETAILED DESCRIPTION OF THE PREFERRED EMBODIMENT

Hereinafter, preferred embodiments of the present invention will be described in detail with reference to the accompanying drawings.

Figure 1:
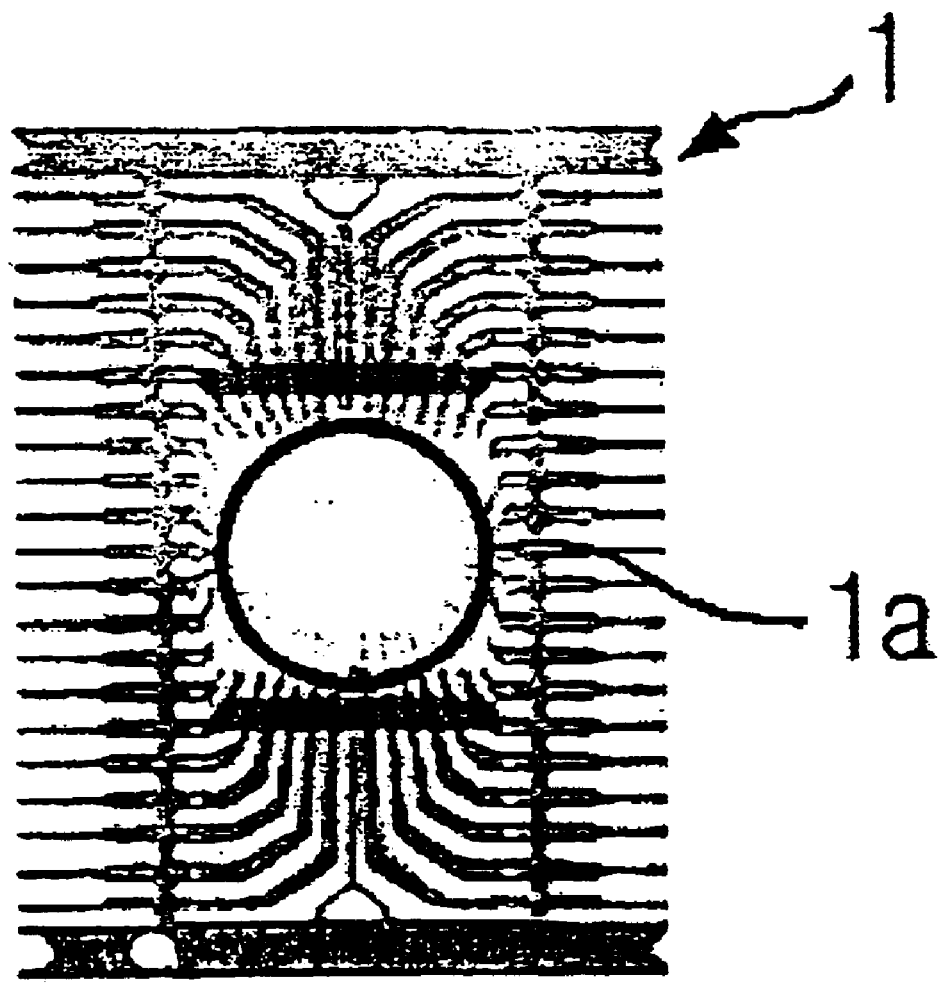
FIG. 1 shows an example of a conventional lead frame.
Figure 2:
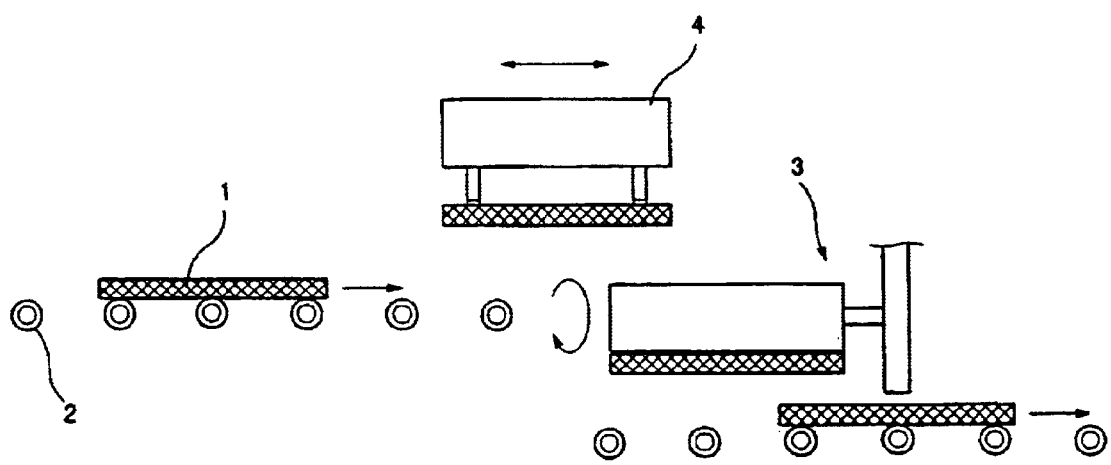
FIG. 2 is a schematic diagram for illustrating operation of a conventional lead frame reversing device.
Figure 3:
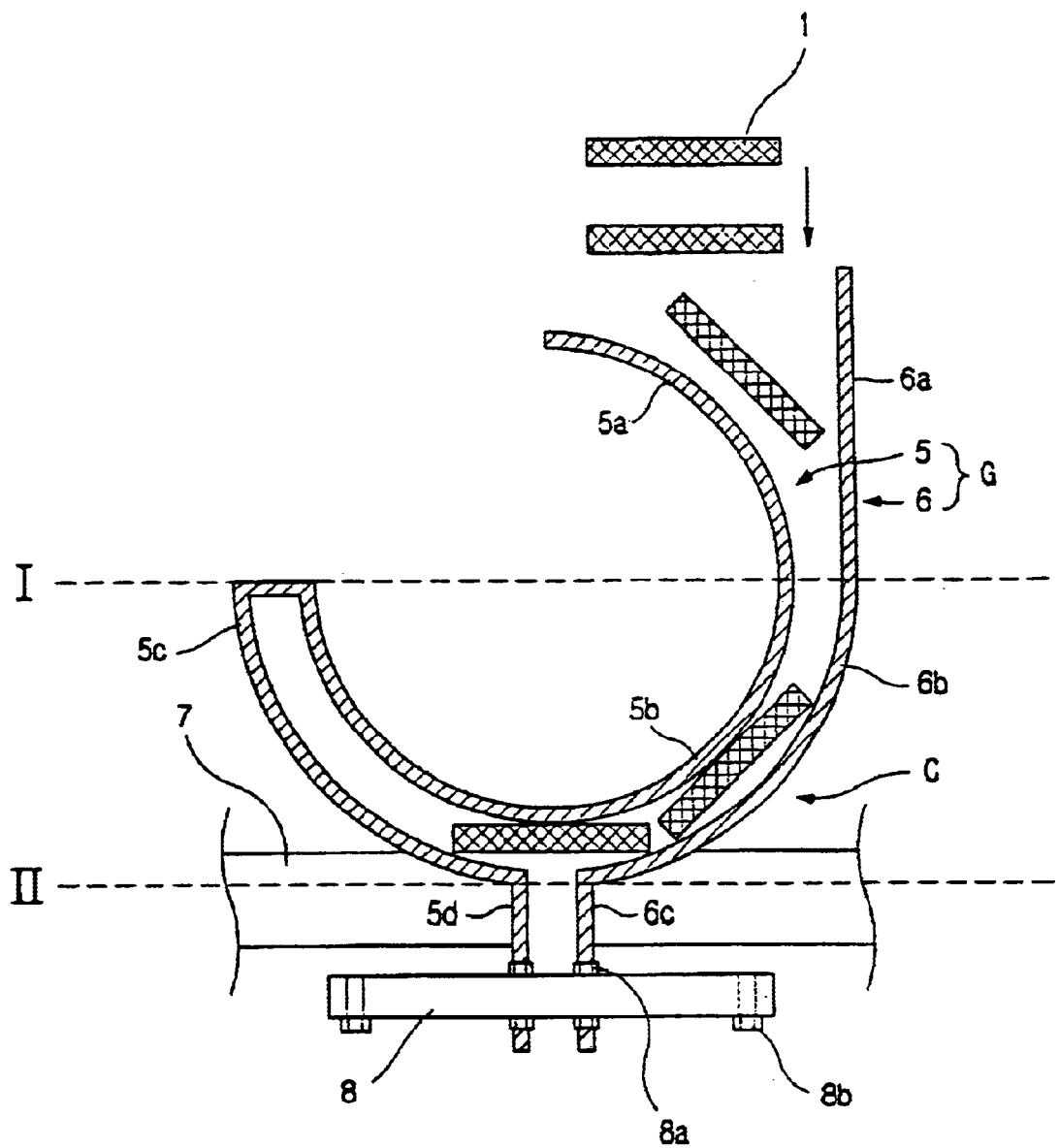
FIG. 3 shows configuration of an apparatus for reversing a lead frame according to a first embodiment of the present invention.

FIG. 3 shows configuration of a lead frame reversing apparatus according to a first embodiment of the present invention. As shown in FIG. 3, the lead frame reversing apparatus of the present invention includes at least one guide rail G having a curved portion C, a base 8 for supporting the guide rail G, and conveying rollers 7 for carrying a lead frame 1 which is naturally fallen below the guide rail G.

The guide rail G plays a role of guiding the lead frame 1, supplied upon an upper portion thereof, to slide and naturally fall down along an arc so that upper and lower surfaces of the lead frame 1 are reversed. Preferably, a plurality of the guide rails G are provided to guide the lead frame 1.

It is also preferred that the guide rail G includes an inner wire 5 and an outer wire 6.

The inner wire 5 includes an upper portion 5a and an inner central portion 5b, which are in an arc shape ranging from an upper area to a central area, outer central portions 5c connected to the inner central portion 5b and extended as much as 90° arc with a predetermined space in the central area, and a lower portion 5d in a straight shape extended downward in connection with the outer central portion 5c. At this time, it is defined that the upper area means an area above a dotted line I, the central area means an area between dotted lines I and II, in FIG. 3.

The outer wire 6 includes an upper portion 6a in a straight shape extended downward with being spaced apart from the upper portion 5a of the inner wire 5, a central portion 6b extended as much as 90° arc in connection with the upper portion 6a, and a lower portion 6c extended downward in a straight shape in connection with the central portion 6b.

At this time, arc portions of the inner wire 5 and the outer wire 6 have different diameters so as to ensure a space through which the lead frame 1 may naturally fall down. For example, the inner and outer wires 5 and 6 are spaced apart 3–10 mm in the arc portions. At this time, the arc portion is used as the curved portion C, and it may not be a part of an exact circle. But, a curved shape can be sufficiently used as the curved portion C if it ensures that the lead frame 1 naturally falling down reverses its upper and lower surfaces.

On the while, the supplied lead frame 1 is dropped upon an upper portion of the inner wire 5, among two wires of the guide rail G, and then fallen down along the guide rail G. Thus, for the smooth falling of the lead frame 1, it is preferably designed that a central line of the inner wire 5 is offset from an initial drop position of the lead frame 1.

The base 8 supports the guide rail G. At this time, a combining member 8a for adjusting the height of the guide rail G to the base 8 is preferably provided at a portion where the base 8 and the guide rail G are combined. For example, if a screw is formed at a lower end of the guide rail G, the combining member 8a can be configured as a nut. Of course, the base 8 and the guide rail G can be combined in various other ways, but not limited to that case.

A balancing bolt 8b is preferably provided to a lower portion of the base 8 in order to adjust horizontal balance and height of the base 8.

The conveying roller 7 is installed so that its outer surface is contacted with a lower surface of the lead frame 1, which is naturally fallen down to a lower portion of the guide rail G. The conveying roller 7 plays a role of horizontally conveying the lead frame 1.

Figure 4:
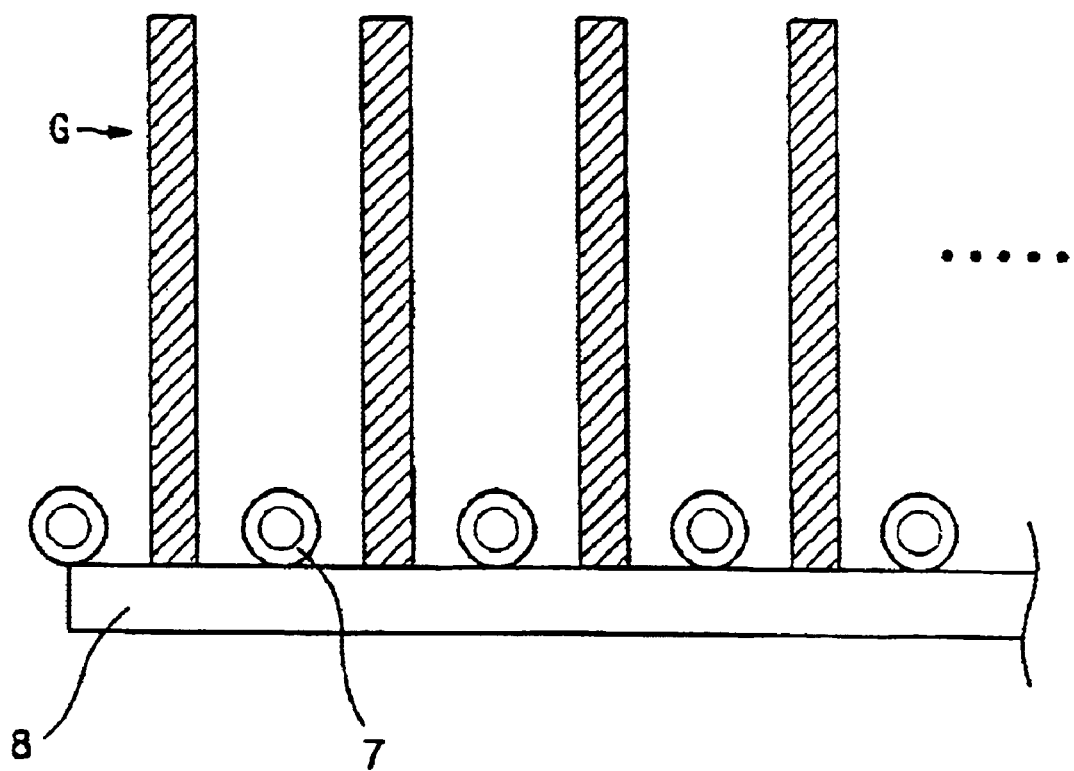
FIG. 4 is a schematic diagram showing conveying rollers disposed between a plurality of guide rails in the embodiment of FIG. 3.

In this configuration, the conveying rollers 7 can be installed between plural guide rails G, as shown in FIG. 4.

Figure 5:
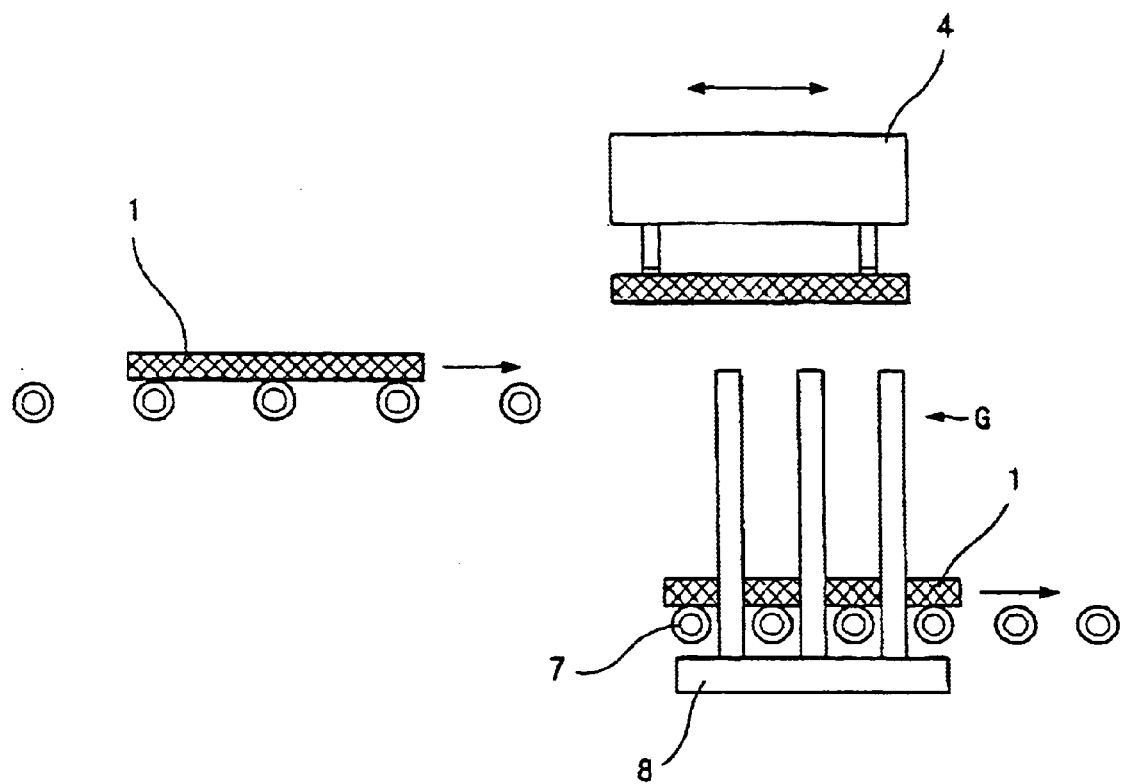
FIG. 5 is a schematic diagram for illustrating operation of the lead frame reversing apparatus according to the present invention.

Now, operation of the lead frame reversing apparatus of the present invention configured as above is described with reference to FIG. 5.

First, a lead frame 1 passing through a silver-plating process is supplied and attached to a carrying unit 4 by absorption. The carrying unit 4 carries the lead frame 1 above the guide rails G, which are arranged in several rows. The carrying unit 4 then drops the lead frame 1 above the guide rails G.

The lead frame 1 dropped on the upper portion of the guide rail G is then slid and fallen down along an arc of the curved portion C formed to the guide rail G as described above with FIG. 3. With falling down along the curved portion C, upper and lower surfaces of the lead frame 1 are reversed.

The lead frame 1 fallen down to the lower portion of the guide rail G is contacted with the outer surface of the conveying rollers 7 arranged near the guide rail G. The conveying rollers 7 then horizontally convey the lead frame 1 to the next process.

Figure 6:
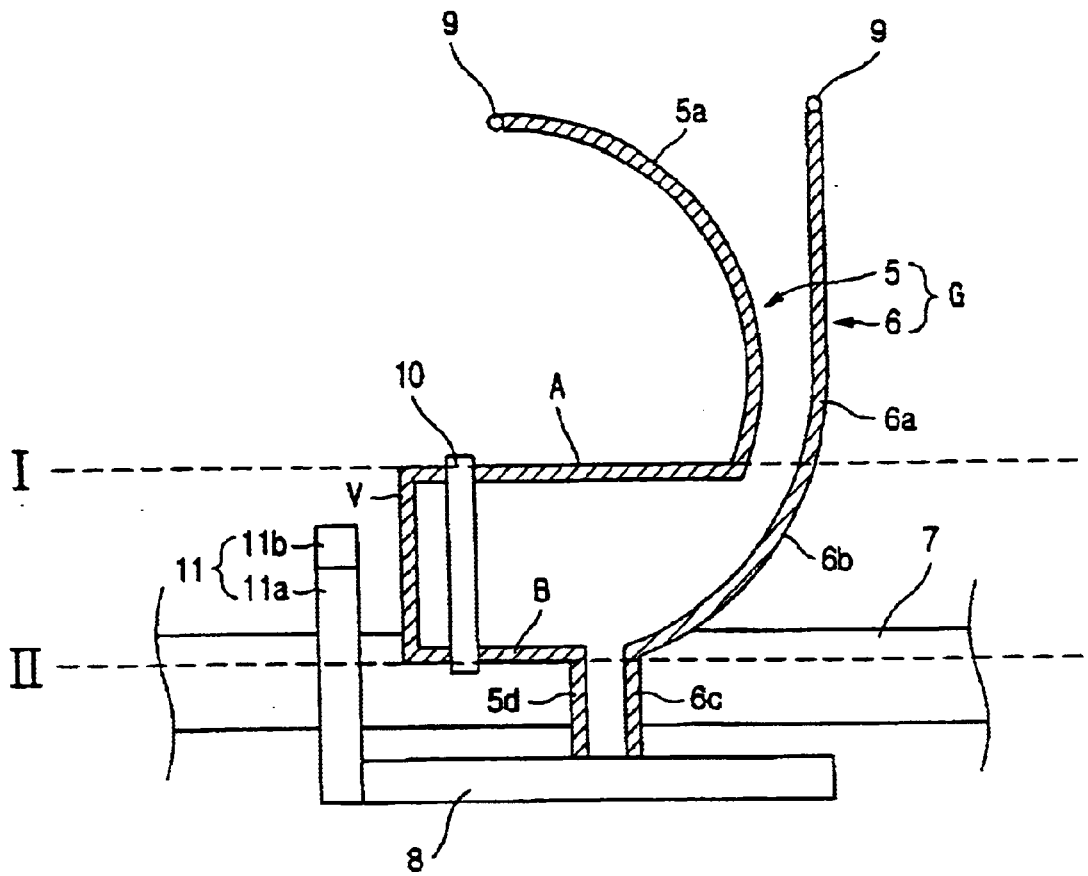
FIG. 6 shows configuration of a lead frame reversing apparatus according to a second embodiment of the present invention.

On the other hand, FIG. 6 shows a lead frame reversing apparatus according to the second embodiment of the present invention. As shown in FIG. 6, to ensure a reversing space of the lead frame 1 in this embodiment, the inner wire 5 among two wires of the guide rail G has a central portion of a 'ㄷ' shape, connected between the upper portion 5a and the lower portion 5d. In other words, the central portion includes a first horizontal portion A, a vertical portion V extended from the first horizontal portion A, and a second horizontal portion B extended from the vertical portion V in a 'ㄷ' shape.

At this time, the first horizontal portion A need not be absolutely horizontal, but it is also possible that the first horizontal portion A is inclined to a predetermined angle to ensure a space in which the lead frame 1 can be reversed.

Preferably, a cushion member 10 is additionally installed to one side of the central portion of the inner wire 5 so as to stop and arrange the lead frame 1 with absorbing shock thereto. This cushion member 10 is made of a shock-absorbing material such as rubber, and both ends of the cushion member 10 are preferably connected to the first horizontal portion A and the second horizontal portion B.

Also preferably, a lower portion of the guide rail G is fixed and integrated with the base 8 so as to prevent the guide rail G from moving due to an external force.

Figure 7:
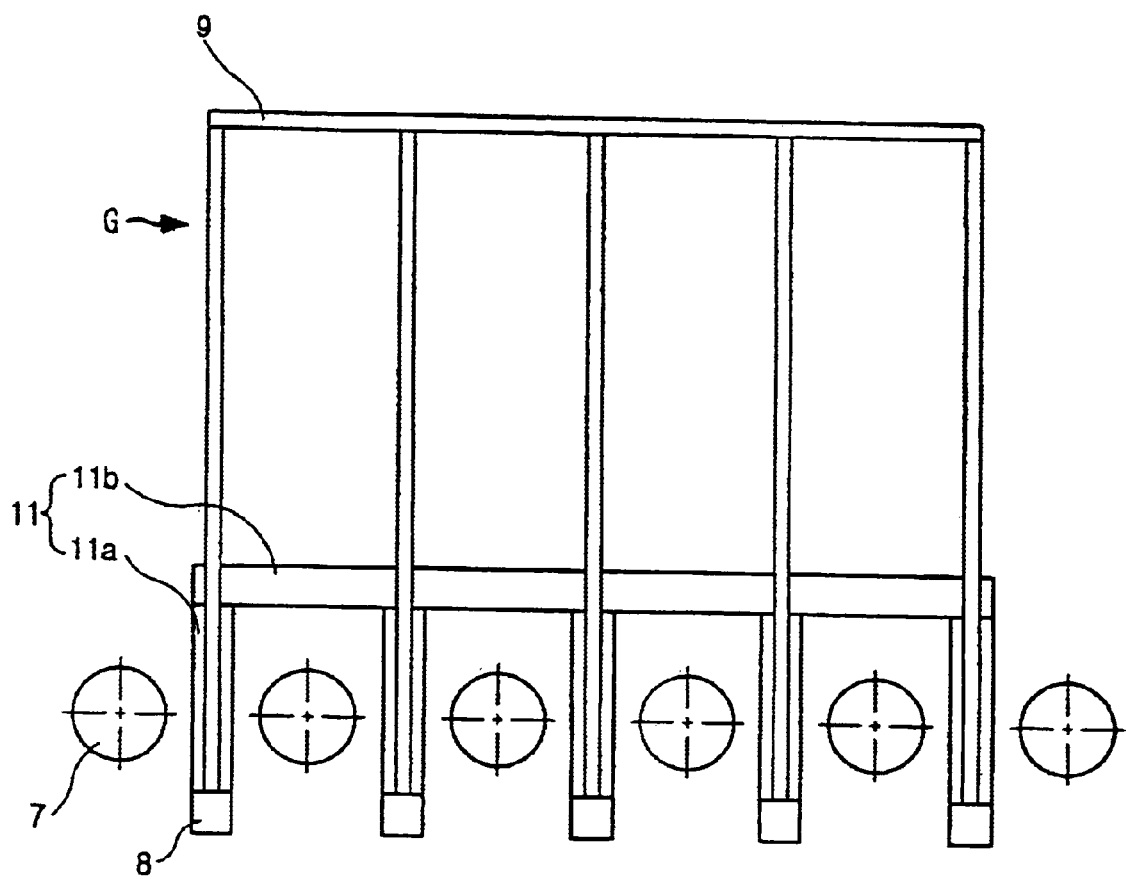
FIG. 7 is a schematic diagram showing conveying rollers disposed between a plurality of guide rails in the embodiment of FIG. 6.

In addition, as shown in FIG. 7, the bases 8 are installed under each guide rail G in parallel to a longitudinal direction of the conveying rollers 7, so the bases 8 can be conveniently installed and repaired without disturbance of the conveying rollers 7.

Preferably, each base 8 is integrally configured through a connection bar 11. For this reason, a first connection bar 11a is vertically attached to one end of the base 8, and an upper end of each first connection bar 11a is connected to a second connection bar 11b. At this time, the base 8 and the connection bar 11 can be modified in various ways, but not limited to the above case.

Additionally, the guide rails G are preferably connected to each other to keep the same height. More preferably, upper ends of the inner wires 5 and upper ends of the outer wires 6 are connected to each other through a connection rod 9.

The lead frame reversing apparatus according to the present invention reverses upper and lower surfaces of the lead frame without power, so energy consumption is dramatically decreased and installation costs are decreased.

In addition, since the lead frame is reversed through a specific structure without use of any robot, the malfunction problem of the prior art is solved.

The preferred embodiments of the present invention have been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. An apparatus for reversing a lead frame, which reverses upper and lower surfaces of the lead frame passing through a silver plating process, the apparatus comprising:

at least one guide rail having a curved portion for guiding the lead frame to be fallen down and reversed along an arc of the curved portion; and a conveying roller provided under the guide rail to horizontally convey the fallen lead frame.

2. The apparatus for reversing a lead frame according to claim 1, wherein the guide rail includes:

an inner wire having an upper portion and an inner central portion, which are in an arc shape ranging from an upper area to a central area, outer central portions connected to the inner central portion and extended as much as 90° arc with a predetermined space in the central area, and a lower portion in a straight shape extended downward in connection with the outer central portion; and an outer wire having an upper portion in a straight shape extended downward with being spaced apart from the upper portion of the inner wire, a central portion extended as much as 90° arc in connection with the upper portion, and a lower portion extended downward in a straight shape in connection with the central portion.

3. The apparatus for reversing a lead frame according to claim 2, wherein a vertical central line of the inner wire is offset from an initial drop position of the lead frame.

4. The apparatus for reversing a lead frame according to claim 2, wherein there are provided a plurality of guide rails, and wherein upper ends of the inner wires and upper ends of the outer wires are connected to each other through a connection rod.

5. The apparatus for reversing a lead frame according to claim 1, wherein the guide rail includes:

an inner wire having an upper portion of an arc shape, a central portion of a 'ㄷ' shape having a first horizontal portion, a vertical portion and a second horizontal portion, and a lower portion in a straight shape extended downward in connection with the central portion; and an outer wire having an upper portion in a straight shape extended downward with being spaced apart from the upper portion of the inner wire, a central portion extended as much as 90° arc in connection with the upper portion, and a lower portion extended downward in a straight shape in connection with the central portion.

6. The apparatus for reversing a lead frame according to claim 5, further comprising a cushion means installed to a side of the central portion of the inner wire to stop and arrange the naturally-fallen lead frame with absorbing shock.

7. The apparatus for reversing a lead frame according to claim 5, wherein a vertical central line of the inner wire is offset from an initial drop position of the lead frame.

8. The apparatus for reversing a lead frame according to claim 5, wherein there are provided a plurality of guide rails, and wherein upper ends of the inner wires and upper ends of the outer wires are connected to each other through a connection rod.

9. The apparatus for reversing a lead frame according to claim 1, further comprising:

a base for supporting the guide rail; and a combining member for combining the guide rail to the base so that the height of the guide rail is adjustable.

10. The apparatus for reversing a lead frame according to claim 9, wherein the bases are installed under each guide rail in parallel to a longitudinal direction of the conveying rollers, and wherein ends of the bases are connected to each other through a connection bar.

11. The apparatus for reversing a lead frame according to claim 1, further comprising a base for supporting the guide rail, wherein the guide rail is integrated with the base.

12. The apparatus for reversing a lead frame according to claim 11, wherein the bases are installed under each guide rail in parallel to a longitudinal direction of the conveying rollers, and wherein ends of the bases are connected to each other through a connection bar.

* * * * *